United States Patent
Mitani et al.

(10) Patent No.: US 9,438,268 B2
(45) Date of Patent: Sep. 6, 2016

(54) CURRENT TYPE D/A CONVERTER, DELTA SIGMA MODULATOR, AND COMMUNICATIONS DEVICE

(71) Applicant: SOCIONEXT INC., Yokohama-shi, Kanagawa (JP)

(72) Inventors: Yosuke Mitani, Tokyo (JP); Takashi Morie, Osaka (JP); Kazuo Matsukawa, Osaka (JP); Masashi Uchida, Osaka (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 14/991,368

(22) Filed: Jan. 8, 2016

(65) Prior Publication Data

US 2016/0126973 A1  May 5, 2016

Related U.S. Application Data

(63) Continuation of application No. PCT/JP2014/001920, filed on Apr. 2, 2014.

(30) Foreign Application Priority Data

Jul. 11, 2013  (JP) ................................ 2013-145820

(51) Int. Cl.
  *H03M 3/00* (2006.01)
  *H03M 1/06* (2006.01)
  (Continued)

(52) U.S. Cl.
  CPC ............ *H03M 3/502* (2013.01); *H03M 1/0656* (2013.01); *H03M 1/0863* (2013.01); *H03M 1/745* (2013.01); *H03M 1/742* (2013.01); *H03M 3/464* (2013.01)

(58) Field of Classification Search
  CPC .......... H03M 1/10; H03M 1/66; H03M 1/74; H03M 1/806; H03M 1/0665; H03M 3/04; H03M 3/502; H03M 3/464; H03M 3/43; H03M 3/376
  USPC .................................................. 341/130–172
  See application file for complete search history.

(56) References Cited

U.S. PATENT DOCUMENTS 5,184,129 A * 2/1993 Fung ...................... H03M 1/002
                                                    341/136
5,442,352 A * 8/1995 Jackson ................. H03M 1/74
                                                    333/81 R (Continued)

FOREIGN PATENT DOCUMENTS

JP   2000-224039 A    8/2000
WO   2012/153371 A1   11/2012

OTHER PUBLICATIONS

S. Norsworthy et al., "Delta-Sigma Data Converters, Theory, Design, and Simulation," Wiley-IEEE Press 1997, p. 1-6.

(Continued)

*Primary Examiner* — Lam T Mai
(74) *Attorney, Agent, or Firm* — McDermott Will & Emery LLP

(57) ABSTRACT

This D/A converter includes a plurality of D/A converter elements, each comprising current sources configured to supply output currents to output nodes, and first switches configured to control the output currents. The output nodes are connected to a capacitor section having second switches and a capacitive load. The D/A converter further includes a switch control circuit configured to control the first switches responsive to digital signals, and also control the second switches in accordance with the control of the ON/OFF state of the first switches.

12 Claims, 15 Drawing Sheets

(51) Int. Cl.
*H03M 1/08* (2006.01)
*H03M 1/74* (2006.01)

(56) References Cited

U.S. PATENT DOCUMENTS

| | | | | |
|---|---|---|---|---|
| 5,570,090 | A * | 10/1996 | Cummins | H03M 1/66 341/136 |
| 6,522,277 | B2 | 2/2003 | Fujimori et al. | |
| 6,587,065 | B1 * | 7/2003 | Hensley | H03F 3/4508 341/155 |
| 7,834,790 | B1 * | 11/2010 | Yin | H03M 1/002 341/144 |
| 8,830,099 | B1 * | 9/2014 | Straayer | H03M 1/06 341/144 |
| 2011/0254718 | A1 * | 10/2011 | Matsukawa | H03M 3/376 341/143 |
| 2012/0286983 | A1 * | 11/2012 | Pfann | H03M 1/66 341/144 |
| 2013/0076549 | A1 * | 3/2013 | Bajdechi | H03M 1/0607 341/144 |
| 2013/0181856 | A1 * | 7/2013 | Guo | H03M 1/66 341/144 |
| 2015/0042498 | A1 * | 2/2015 | Onody | H03M 1/66 341/144 |

OTHER PUBLICATIONS

H. Inose et al., "A Unity Bit Coding Method by Negative Feedback," USA Proceedings of the IEEE, vol. 51 Nov. 1963, pp. 1524-1535.

Y. Geerts et al., "Design of Multi-Bit Delta-Sigma A/D Converters," (USA) Kluwer Academic Publishers, May 2002, pp. 74-97.

K. Matsukawa et al., "A. 69.8 dB SNDR 3rd-order Continuous Time Delta-Sigma Modulator with an Ultimate Low Power Tuning System for a Worldwide Digital TV-Receiver," Custom Integrated Circuits Conference (CICC), 2010 IEEE (USA), Sep. 19-22, 2010, pp. 1-4.

International Search Report issued in Application No. PCT/JP2014/001920 dated Jul. 1, 2014, with English translation.

Written Opinion issued in International Application No. PCT/JP2014/001920 dated Jul. 1, 2014, with English translation.

* cited by examiner

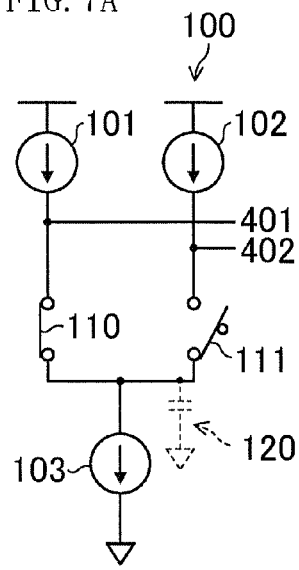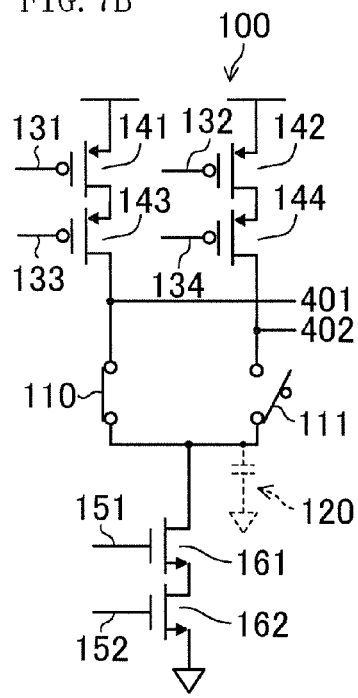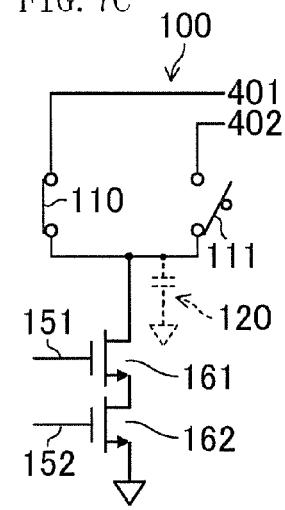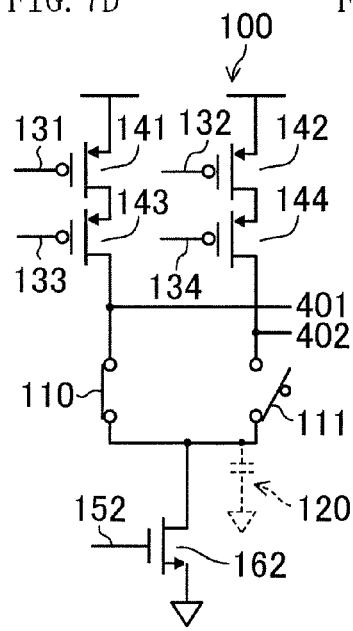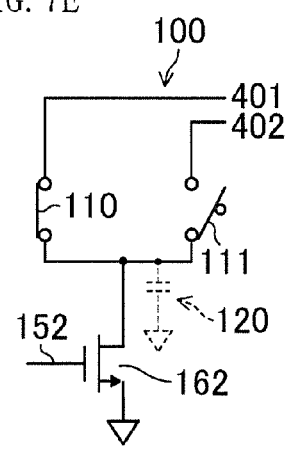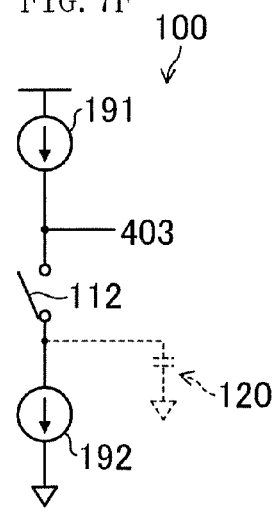

CURRENT TYPE D/A CONVERTER, DELTA SIGMA MODULATOR, AND COMMUNICATIONS DEVICE

CROSS-REFERENCE TO RELATED APPLICATIONS

This is a continuation of International Application No. PCT/JP2014/001920 filed on Apr. 2, 2014, which claims priority to Japanese Patent Application No. 2013-145820 filed on Jul. 11, 2013. The entire disclosures of these applications are hereby incorporated by reference.

BACKGROUND

The present disclosure relates to a current type digital-to-analog (D/A) converter and a delta-sigma modulator including such a D/A converter, and particularly relates to a technique for reducing occurrence of harmonic distortion.

It general, it is known that analog-to-digital (A/D) converters for use in delta-sigma modulators achieve, by noise shaping and oversampling techniques, higher precision and lower power dissipation than Nyquist A/D converters do. Among various types of delta-sigma modulators, a continuous-time delta-sigma modulator has been known as a tool suitably used to realize high-speed and broadband operation. In a continuous-time delta-sigma modulator, an input signal passes through a loop filter including a plurality of analog integrators or resonators which are cascaded together, and then is quantized by a quantizer. The digital output thus quantized is converted next into an analog signal by a digital-to-analog (D/A) converter and then fed back (see, for example, Steven R. Norsworthy, Richard Schreier and Gabor C. Temes, "Delta-Sigma Data Converters Theory, Design and Simulation," (USA), Wiley-IEEE Press, 1997, pp. 1-6, and H. Inose, Y. Yasuda, "A unity bit coding method by negative feedback," (USA), Proceedings of the IEEE, November 1963, Vol. 51, pp. 1524-1535).

In general, in order to improve the conversion precision of a delta-sigma modulator, a multi-bit quantizer and a multi-bit feedback D/A converter may be used by increasing the number of elements that form the quantizer and the feedback D/A converter. However, when a multi-bit feedback D/A converter is used, some distortion occurs due to a mismatch between the elements of the feedback D/A converter, resulting in a decrease in the conversion precision of the delta-sigma modulator. To address this problem, a dynamic element matching (DEM) circuit has been used to shuffle the elements of a D/A converter to perform D/A conversion. This allows for leveling the mismatch between the elements and eventually reducing the distortion (see, for example, Y. Geerts, M. Steyaert, W. Sansen, "Design of Multi-bit Delta-Sigma A/D Converters," (USA), Kluwer Academic Publishers, May 2002, pp. 74-97).

When data weighted averaging (DWA) is used as an algorithm for a DEM circuit in a delta-sigma modulator, the D/A converter selected in such a situation has correlation with the input frequency due to the characteristics of the DWA. Harmonic distortion occurs in the output signal of the delta-sigma modulator due to a parasitic capacitance of the feedback D/A converter, and an input offset voltage of an operational amplifier in the loop filter (see, for example, Kazuo Matsukawa, and six other persons, "A 69.8 dB SNDR 3rd-order Continuous Time Delta-Sigma Modulator with an Ultimate Low Power Tuning System for a Worldwide Digital TV-Receiver," Custom Integrated Circuits Conference (CICC), 2010 IEEE (USA), 19-22 Sep. 2010, pp. 1-4).

U.S. Pat. No. 6,522,277 discloses a bi-directional DWA (Bi-DWA) technique for a DEM circuit in a delta-sigma modulator. According to this technique, two pointers are provided for the DEM circuit, and are alternately moved in two opposite directions, thereby reducing occurrence of harmonic distortion including second-order harmonics.

SUMMARY

Although the Bi-DWA technique as disclosed in U.S. Pat. No. 6,522,277, for example, allows for reducing the harmonic distortion, such a technique can level the mismatch less effectively than a common DWA technique does. This results in an increase in noise, which is a problem.

In view of the foregoing background, it is therefore an object of the present disclosure to provide a circuit which is capable of reducing occurrence of harmonic distortion (in particular, second-order harmonic distortion), and which does not lessen the effect of leveling the mismatch by the DWA technique.

A first aspect of the present disclosure provides a current type D/A converter including a plurality of D/A converter elements and performing D/A conversion of a digital input signal. Each of the D/A converter elements includes: a current source configured to supply output current to an output node; and a first switch configured to control the output current by switching between electrical connection and disconnection, the current source and the first switch being connected in series to each other. An output node of at least one of the D/A converter elements is provided with a capacitor section including a capacitive load and a second switch connected between the capacitive load and the output node, and configured to switch between electrically connected and disconnected states. The D/A converter further comprises a control circuit configured to control the ON/OFF state of the first switch responsive to the digital input signal, and control the ON/OFF state of the second switch in accordance with the control of the ON/OFF state of the first switch. The control circuit controls the ON/OFF state of the second switch such that the D/A converter reduces a magnitude of variation in an error-representing electric charge which is to be transferred to the output node.

A second aspect of the present disclosure provides a delta-sigma modulator including: an analog filter; a quantizer configured to receive an output signal of the analog filter and convert the signal into a digital output signal; a DEM circuit configured to receive the digital output signal of the quantizer; and the current type D/A converter of the first aspect configured to D/A convert the digital output signal of the DEM circuit into an analog signal, and feed the analog signal back to the analog filter.

A third aspect of the present disclosure provides a communications device including the delta-sigma modulator of the second aspect.

According to the first aspect of the present disclosure, the control circuit controls the ON/OFF state of the first switch responsive to a digital input signal, and controls the ON/OFF state of the second switch in accordance with the control of the ON/OFF state of the first switch. For example, review a case where, in a situation where the ON/OFF state of the first switch is controlled by changing the level of the digital output signal, the quantity of electric charge representing an error (hereinafter referred to as "error-representing electric charge") varies due to the use of the plurality of the D/A converter elements. Even in such a case, the control circuit allows for controlling, in accordance with the control of the ON/OFF state of the first switch, the ON/OFF state of the second switch so as to reduce the variation in the error-representing electric charge. That is because the second switch is configured to switch the electrical connection and disconnection between the capacitive load and the output node, and thus, the control of the ON/OFF state of the second switch allows for varying the error-representing electric charge. This allows for reducing the magnitude of variation in the sum of the electric charges output from the current type D/A converter (the sum of the quantities of the error-representing electric charge and the electric charge produced by the capacitive load). That is to say, this allows for cancelling the error-representing electric charge, and reducing occurrence of harmonic distortion (in particular, second-order harmonic distortion). Also, the output signal of the current type D/A converter according to the present disclosure does not have frequency dependence with respect to the digital input signal, and therefore, this does not lessen the effect of leveling the mismatch.

Accordingly, application of the current type D/A converter of the first aspect to a delta-sigma modulator as in the second aspect, for example, allows for providing a circuit which reduces occurrence of harmonic distortion (in particular, second-order harmonic distortion) and which does not lessen the effect of leveling the mismatch. Also, application of the delta-sigma modulator of the second aspect to a communications device as in the third aspect allows for providing a communications device with high precision.

According to the present disclosure, the ON/OFF state of the second switch is controlled in accordance with the control of the ON/OFF state of the first switch. This allows for cancelling the error-representing electric charge caused by the use of the plurality of D/A converter elements. This allows for reducing occurrence of harmonic distortion (in particular, second-order harmonic distortion). Furthermore, according to the present disclosure, the effect of leveling the mismatch is not lessened.

BRIEF DESCRIPTION OF THE DRAWINGS

FIGS. 7A-7F illustrate variations of the D/A converter element.

DETAILED DESCRIPTION (Generation Principle of Error-Representing Electric Charge)

Figure 12:
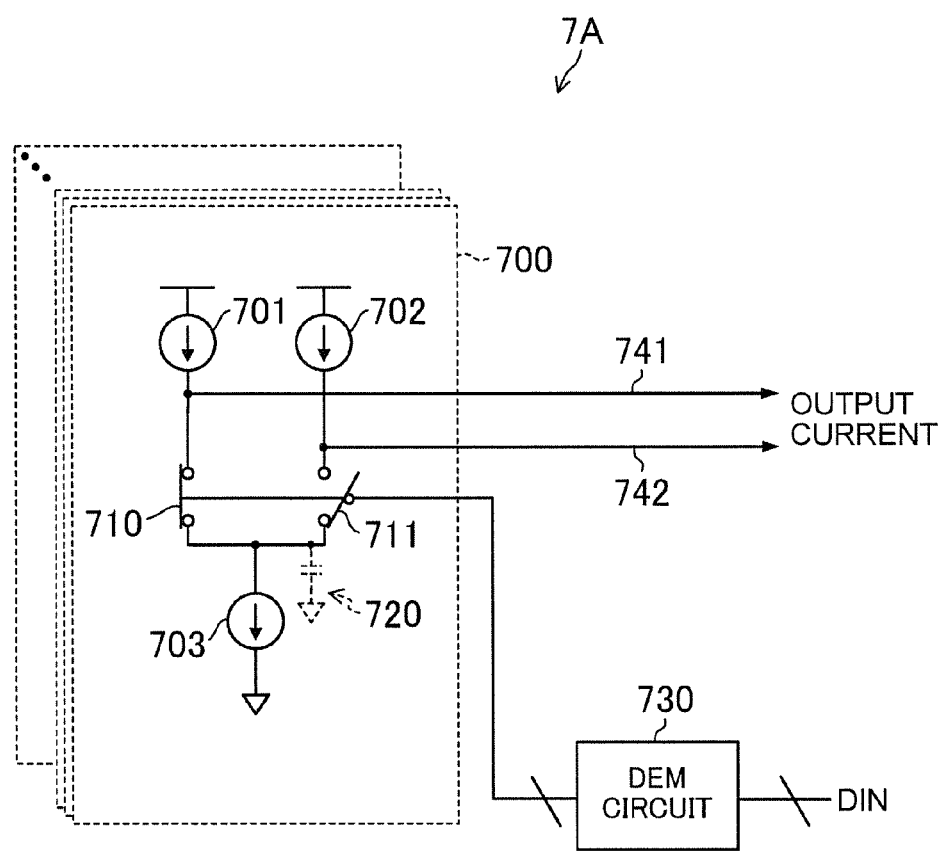
FIG. 12 conceptually illustrates how a general D/A converter and a general DEM circuit may be connected together.
Figure 13:
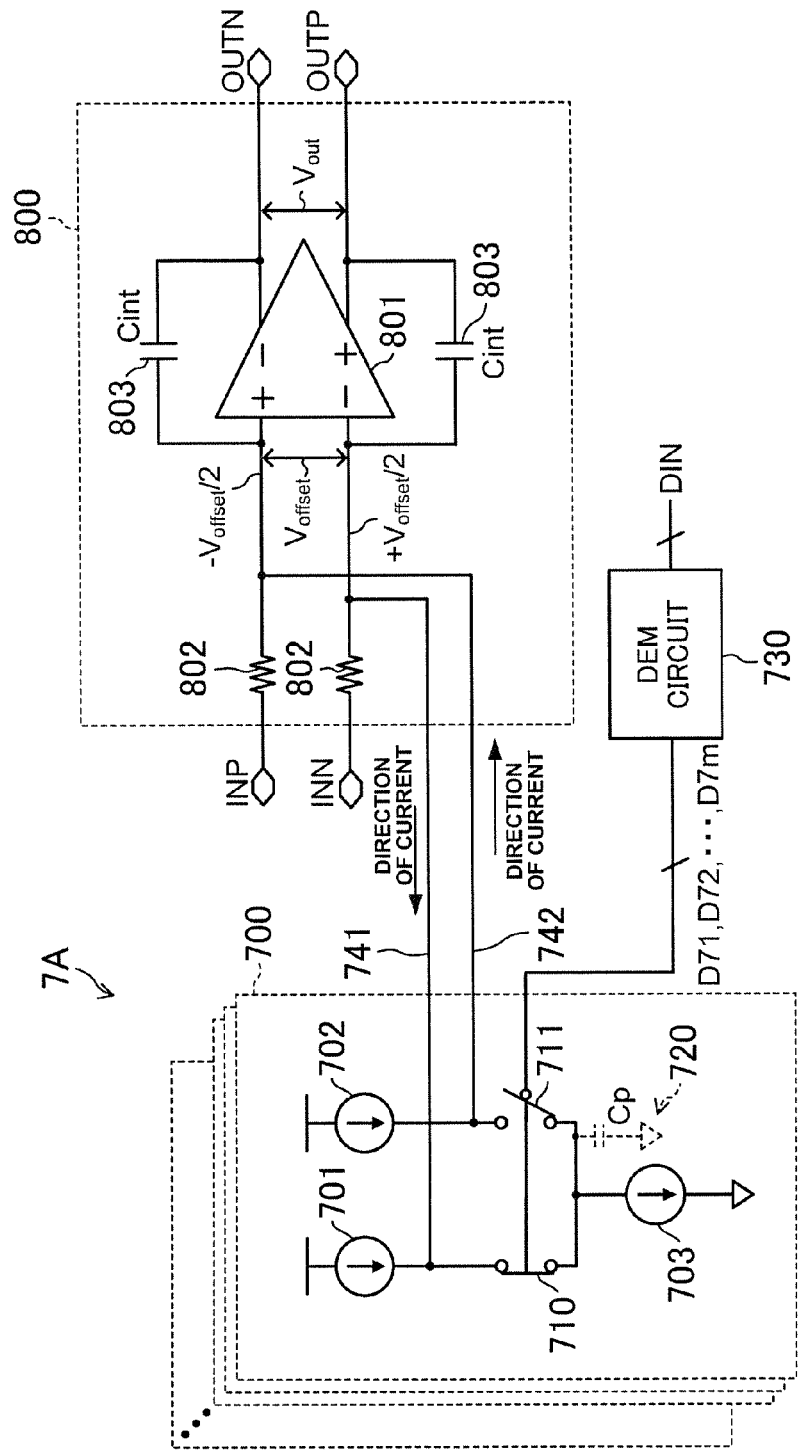
FIG. 13 illustrates how a D/A converter and an integrator may be connected together in a general delta-sigma modulator.

FIGS. 12 and 13 illustrate, when a delta-sigma modulator includes a DEM circuit 730, how a current type D/A converter 7A and the DEM circuit 730 may be connected together, and how the current type D/A converter 7A and an integrator 800 may be connected together.

Here, it is assumed that the D/A converter 7A in the delta-sigma modulator is a multi-bit converter. Specifically, the D/A converter 7A includes a plurality of D/A converter elements 700, 700, . . . , which are connected together in parallel, as illustrated in FIGS. 12 and 13.

Each D/A converter element 700 is comprised of current sources 701, 702, and 703, and switches 710 and 711. The current source 701 is connected between a power supply and one output node 741 of the D/A converter element 700. Likewise, the current source 702 is connected between the power supply and the other output node 742. The output node 741 is connected to one terminal of the switch 710, and the output node 742 is connected to one terminal of the switch 711. The other terminals of the switches 710 and 711 are both connected to a common node, and the current source 703 is connected between the common node and the ground. Here, a parasitic capacitor 720 having a capacitance value Cp is present between the switches 710 and 711 and the current source 703. The current value of the current source 703 is twice as large as that of the current sources 701 and 702.

The DEM circuit 730 is connected to the switches 710 and 711 of each D/A converter element 700, and controls the ON/OFF states of the switches 710 and 711 of each D/A converter element 700 responsive to digital signals D71, D72, . . . , and D7$m$ (where m is an integer indicating the total number of the elements). This allows for controlling input and output of current through the output nodes 741 and 742.

As illustrated in FIG. 13, the integrator 800 receiving output currents of the D/A converter elements 700, 700, . . . is comprised of an operational amplifier 801, resistors 802 and 802, and integrating capacitors 803 and 803 having a capacitance value Cint. The operational amplifier 801 receives differential input signals INP and INN through the resistors 802 and 802, and outputs differential output signals OUTN and OUTP, of which the polarities are opposite to each other. The output signals OUTN and OUTP are fed back to the input terminals of the integrator 800 through the integrating capacitors 803 and 803.

Now, the operation of the delta-sigma modulator will be described as to a series of operations of transferring electric charge to the integrating capacitor 803 of the integrator 800. First, a digital signal DIN that has been output from a quantizer (not shown) and has been fed back is input to each D/A converter element 700 through the DEM circuit 730, thereby controlling the ON/OFF states of the switches 710 and 711. For example, if positive current is output from the D/A converter element 700, an ON signal is input to the switch 710 while an OFF signal is input to the switch 711. As can be seen, when the switch is turned ON, the current source 703 has a larger current value than the current source 701. As a result, current flows through the output node 741 in such a direction as to draw the current from the integrator 800 to the D/A converter element 700, while current flows through the output node 742 in such a direction as to supply the current from the D/A converter element 700 to the integrator 800. The current input to, or output from, the integrator 800 charges or discharges the integrating capacitors 803 and 803.

Next, it will be described how the error-representing electric charge is transferred to the integrating capacitors 803 and 803 of the integrator 800 from the D/A converter element 700. It is assumed that an input conversion offset voltage $V_{offset}$ (hereinafter simply referred to as "offset voltage $V_{offset}$") is present in the operational amplifier 801 of the integrator 800. In the following example, it will be described how the modulator operates in (1) a case where the digital signal D71 changes from "1" to "0," and then changes to "1," and in (2) a case where the digital signal D71 changes from "0" to "1," and then changes to "0."

<Case (1)>

When the digital signal D71 changes from "1" to "0," the switch 710 turns ON and the switch 711 turns OFF in the D/A converter element 700. As a result, the potential difference produced by the offset voltage $V_{offset}$ charges the parasitic capacitor 720 with a quantity of electric charge Qp1 expressed by $-V_{offset} \times Cp/2$. Then, when the digital signal D71 changes from "0" to "1," the switch 710 turns OFF and the switch 711 turned ON. As a result, the potential difference produced by the offset voltage $V_{offset}$ charges the parasitic capacitor 720 with a quantity of electric charge Qp2 expressed by $+V_{offset} \times Cp/2$. A part of the electric charge ($-V_{offset} \times Cp$) representing the difference between these electric charges Qp1 and Qp2 is transferred to the integrating capacitors 803 and 803. Assuming that the proportion of the electric charge to be transferred is $\alpha$, the error-representing electric charge which is electric charge to be transferred to the integrating capacitors 803 and 803 is expressed by $\alpha \times V_{offset} \times Cp$. As a result, the output voltage $V_{out}$ of the integrator 800 comes to have an error-representing voltage expressed by $\alpha \times V_{offset} \times Cp$, where $\alpha$ is a coefficient determined by a factor of the circuit, and varies according to, e.g., the bandwidth or the DC gain of the operational amplifier 801.

<Case (2)>

When the digital signal D71 changes from "0" to "1," the switch 710 turns OFF and the switch 711 turns ON in the D/A converter element 700. As a result, the potential difference produced by the offset voltage $V_{offset}$ charges the parasitic capacitor 720 with a quantity of electric charge Qp3 expressed by $+V_{offset} \times Cp/2$. Then, when the digital signal D71 changes from "1" to "0," the switch 710 turns ON and the switch 711 turns OFF. As a result, the potential difference produced by the offset voltage $V_{offset}$ charges the parasitic capacitor 720 with a quantity of electric charge Qp4 expressed by $-V_{offset} \times Cp/2$. A part of the electric charge ($-V_{offset} \times Cp$) representing the difference between these electric charges Qp3 and Qp4 is transferred to the integrating capacitors 803 and 803. Assuming that the proportion of the electric charge to be transferred is $\alpha$, the error-representing electric charge which is the electric charge to be transferred to the integrating capacitors 803 and 803 is expressed by $\alpha \times V_{offset} \times Cp$. As a result, the output voltage Vout of the integrator 800 comes to have an error-representing voltage expressed by $\alpha \times V_{offset} \times Cp$, where $\alpha$ is a coefficient determined by a factor of the circuit, and varies according to, e.g., the bandwidth or the DC gain of the operational amplifier 801.

As can be seen from the foregoing, the presence of the parasitic capacitor 720 and the offset voltage $V_{offset}$ causes the output voltage $V_{out}$ of the integrator 800 to have an arithmetic error corresponding to the error-representing voltage expressed by $\alpha \times V_{offset} \times Cp/Cint$, no matter whether the digital signal D71 changes from "1" to "0" and then changes to "1," or changes from "0" to "1" and then changes to "0." Even if any of the other digital signals D72, . . . , and D7*m* changes, the same can be said as in the case where the digital signal D71 changes.

(Generation Principle of Harmonic Distortion)

Next, it will be described how the error-representing electric charge (error voltage) is output as harmonic distortion.

Figures 14A, 14B:
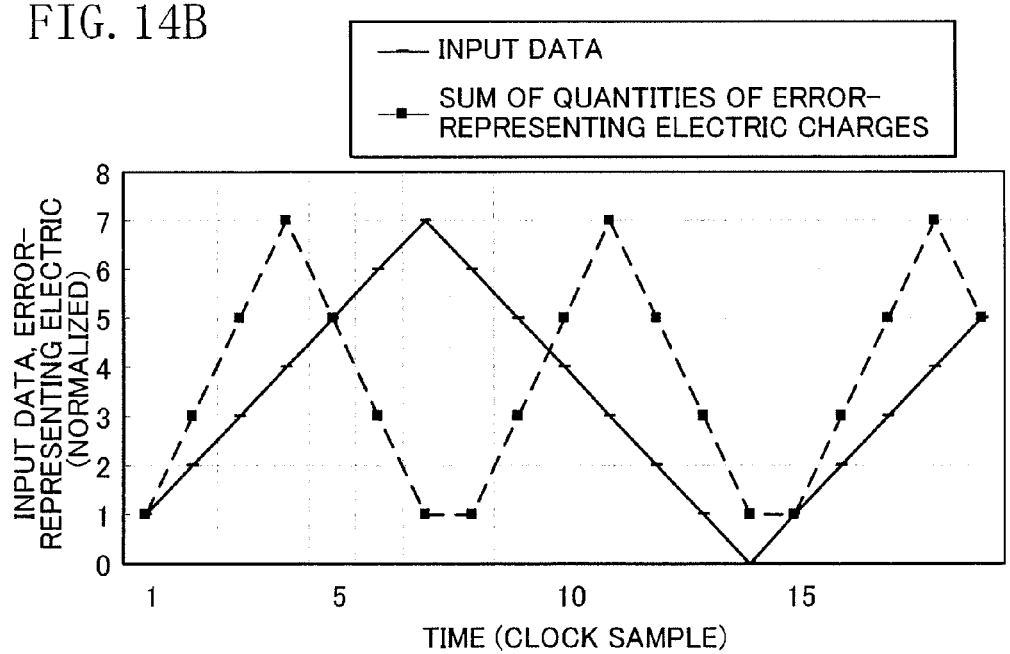
FIGS. 14A and 14B show an example of the operation of the current type D/A converter and the DEM circuit.

FIGS. 14A and 14B show an example of the operation of a D/A converter 7A which includes seven elements and a common DEM circuit 730 which corresponds to the seven elements of the D/A converter 7A and adopts the DWA algorithm. In the table shown in FIG. 14A, time elapses toward the bottom, and each row indicates a state in each clock sample. "Input data" indicates data to be input to the DEM circuit 730. "Selected element" indicates the serial numbers of selected ones of the D/A converter elements 700, 700, . . . , and current is output if the value in this item is "1." "Quantity of electric charge of parasitic capacitor in D/A converter" indicates the state of the electric charge stored in the parasitic capacitor 720 present between the current source 703 and switches 710 and 711 of each D/A converter element 700 illustrated in FIG. 13. "−1" indicates a discharged state, while "1" indicates a charged state. "Changed D/A converter element" indicates the serial numbers of the D/A converter elements 700, 700, . . . , which have been charged or discharged. "0" indicates the D/A converter element 700 which has not changed, and "1" indicates the D/A converter element 700 which has been either charged or discharged. "Sum of quantities of error-representing electric charges" indicates the total number of the D/A converter elements 700 which have been charged or discharged, i.e., the sum of the arithmetic errors transferred to the integrator 800.

Figure 15:
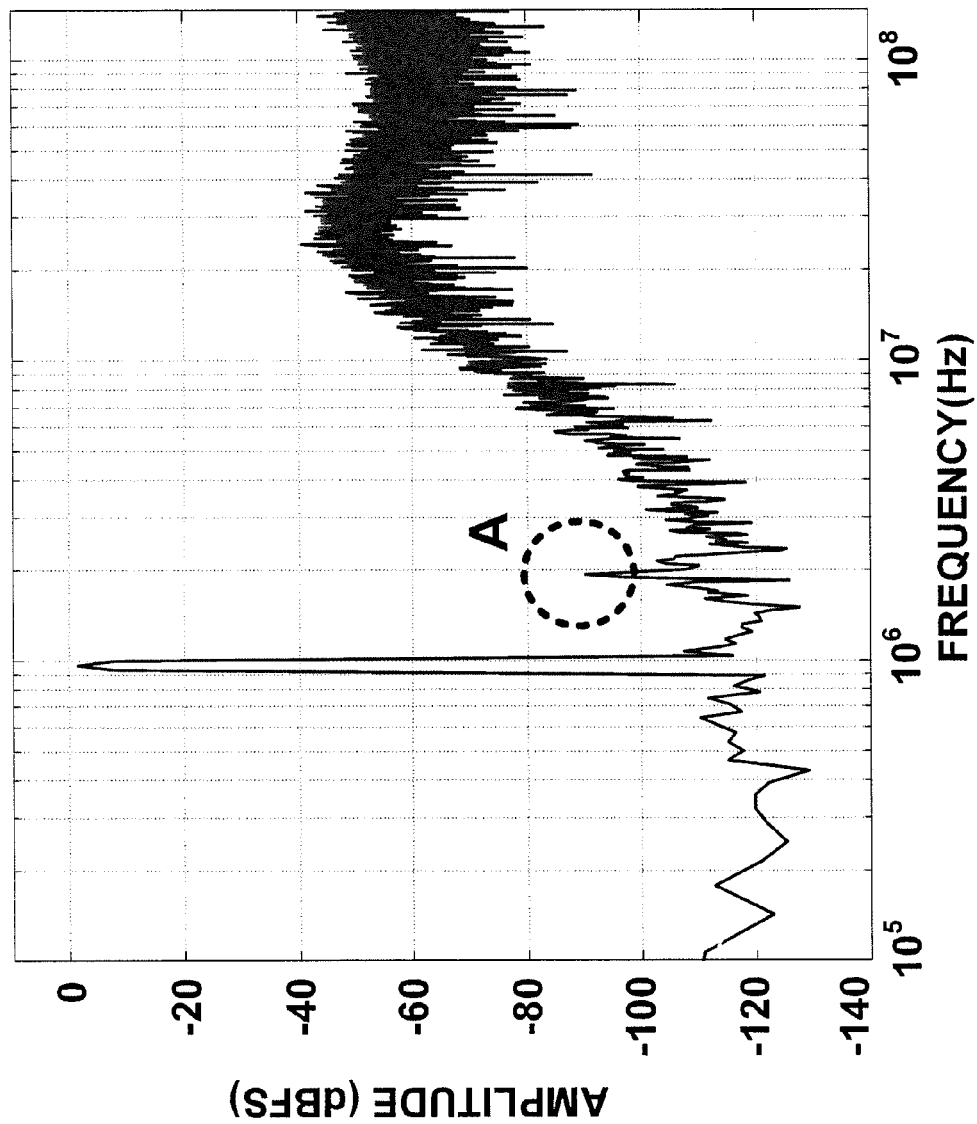
FIG. 15 shows an example of output frequency characteristics of a common delta-sigma modulator in which DWA is used.

FIG. 14B shows a relation between the passage of time (clock sample) and "input data" and a relation between the passage of time and "sum of quantities of error-representing electric charges." In FIG. 14B, the solid line graph shows how "input data" changes with time, and the broken line graph shows how "sum of quantities of error-representing electric charges" changes with time. As shown in FIG. 14B, the time it takes for "input data" to complete one cycle of change corresponds to the time it takes for the "sum of quantities of error-representing electric charges" to complete two cycles of change. In other words, the frequency of change in an error voltage (the sum of quantities of error-representing electric charges) due to the error-representing electric charge is twice as high as the input frequency of the input data. If a DEM circuit having such cyclicity is used for, e.g., a delta-sigma modulator, the error-representing electric charges described above will be integrated due to an offset voltage of an operational amplifier inside an analog filter, and the integral thereof will manifest itself as a second-order harmonic in the output of the delta-sigma modulator. FIG. 15 shows an example of an output spectrum of a delta-sigma modulator which adopts the DWA algorithm. As shown in FIG. 15, second-order harmonic distortion that is twice as large as the one observed in an input signal is generated due to the error voltage caused by the error-representing electric charge (area A in FIG. 15). Therefore, some countermeasures need to be taken.

Embodiments of the present disclosure will now be described in detail with reference to the accompanying drawings. Note that description of any element performing substantially the same function as its counterpart already described may be omitted herein to avoid redundancies.

(Delta-Sigma Modulator)

Figure 1:
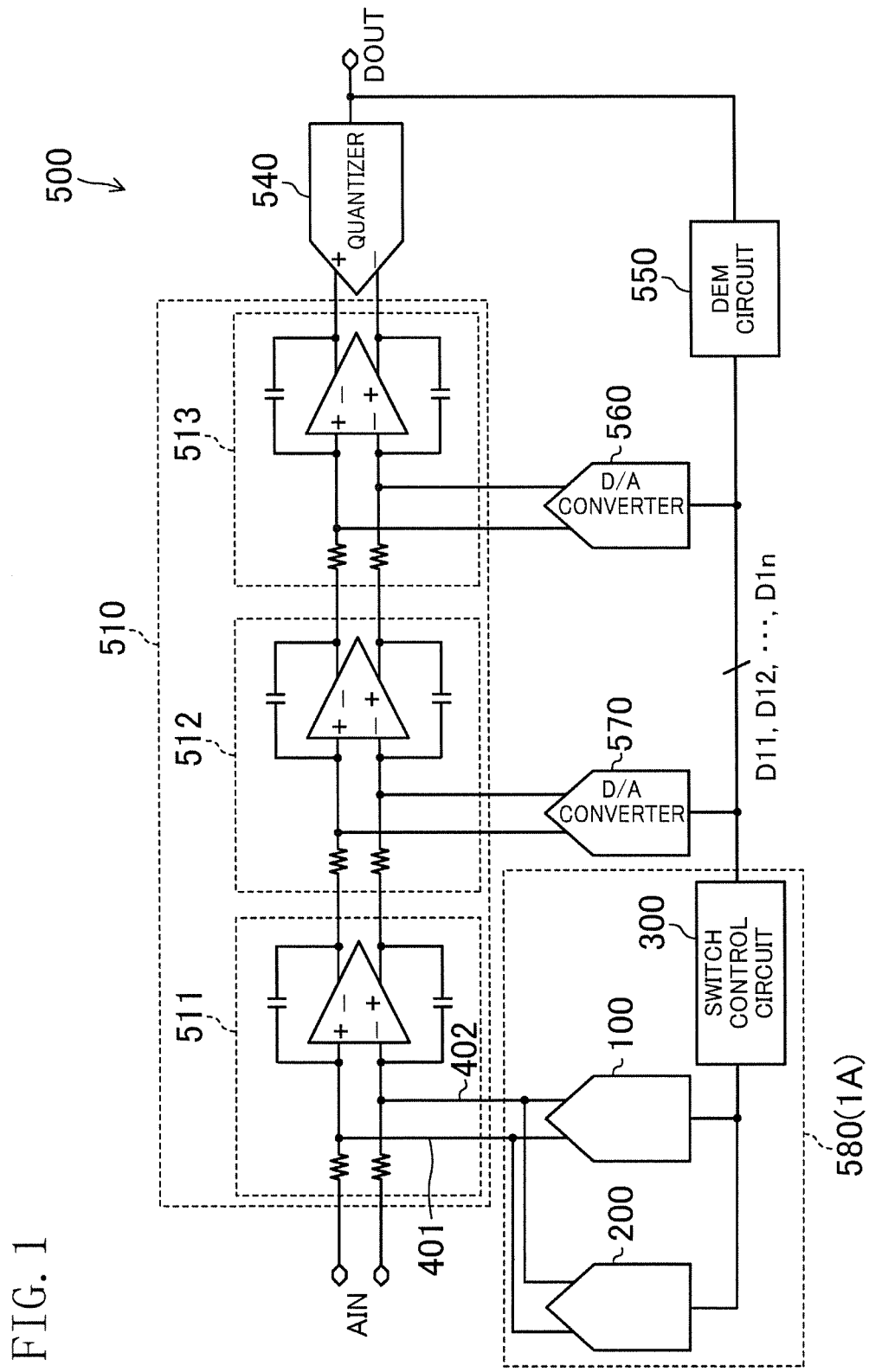
FIG. 1 conceptually illustrates a delta-sigma modulator including a current type D/A converter according to the present disclosure.

FIG. 1 conceptually illustrates a delta-sigma modulator 500 including a current type D/A converter 1A according to the present disclosure. In this disclosure, a third-order delta-sigma modulator 500 including an analog filter 510 having three cascaded integrators 511, 512, and 513 will be described as an example.

The delta-sigma modulator 500 shown in FIG. 1 includes: the cascaded integrators 511, 512, and 513 configured to receive an analog input signal AIN and integrate the signal; a quantizer 540 configured to receive the analog signal output from the integrator 513, and generate and output a digital output signal DOUT; a DEM circuit 550; and D/A converters 560, 570, and 580. In the example delta-sigma modulator 500 illustrated in FIG. 1, the current type D/A converter 1A according to the present disclosure is applied to the D/A converter 580.

The DEM circuit 550 receives the digital output signal DOUT of the quantizer 540 and outputs digital signals D11, D12, . . . , and D1n (where n is an integer indicating the total number of the elements) as digital input signals to the respective D/A converter elements (not illustrated) of each of the D/A converters 560 and 570, and a switch control circuit 300 of the D/A converter 580 (1A).

The D/A converter 560 and 570 receive the digital signals D11, D12, . . . , and D1n, convert those signals into analog signals, and feed the analog signals back to the integrators 513 and 512, respectively.

(D/A Converter)

Figure 2:
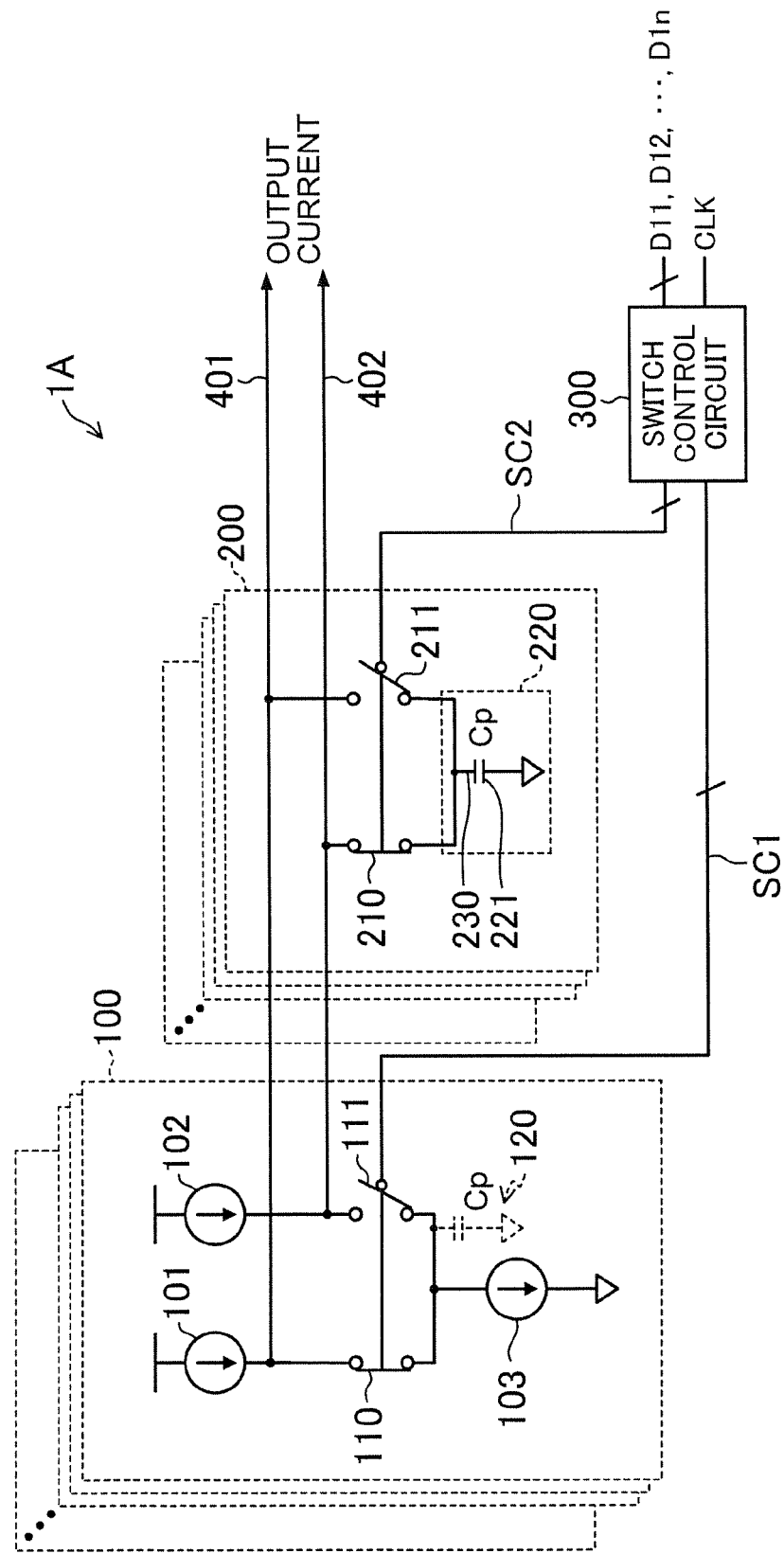
FIG. 2 conceptually illustrates the current type D/A converter according to the present disclosure.

FIG. 2 conceptually illustrates the current type D/A converter 1A according to the present disclosure. In FIG. 2, the D/A converter 1A is a multi-bit converter, and includes: a plurality of D/A converter elements 100, 100, . . . , connected in parallel with each other and functioning as a plurality of D/A converter elements; a plurality of capacitor sections 200, 200, . . . , each provided for an associated one of the D/A converter elements 100, and each connected to the output nodes 401 and 402 of the associated D/A converter element 100; and a switch control circuit 300 functioning as the control circuit.

The D/A converter element 100 includes: a current source 101 connected between a power supply and the output node 401; a current source 102 connected between the power supply and the output node 402; switches 110 and 111 functioning as the first switches and connected at one terminal thereof to the output nodes 401 and 402, respectively; and a current source 103 connected between the ground functioning as the first power supply and the other terminals of the switches 110 and 111. The switches 110 and 111 are configured to be switchable between electrically connected and disconnected states. In addition, there is a parasitic capacitor 120 having a capacitance value Cp between the switches 110 and 111 and the current source 103. The current value of the current source 103 is twice as large as that of the current sources 101 and 102.

The capacitor section 200 includes: switches 210 and 211 functioning as second switches and connected at one terminal thereof to the output nodes 402 and 401, respectively; and a capacitive load 220 connected to the other terminals of the switches 210 and 211 via a connection node 230. The capacitive load 220 may be configured as a capacitive element 221 connected between the other terminals of the switches 210 and 211 (i.e., the connection node 230) and the ground, as illustrated in FIG. 2, for example. The capacitance value Cp of the capacitive element 221 is set to be the same as the capacitance value Cp of the parasitic capacitor 120 in the D/A converter element 100 to which this capacitive element 221 is connected. The above range of the capacitance value is determined by the precision (the degree of noise reduction achieved) required for the D/A converter 1A. For example, it is set to fall within ±30% of the capacitance value Cp of the parasitic capacitor 120. The capacitive element 221 may be configured as a passive element such as an interconnect capacitor or may be configured as an active element such as a metal oxide semiconductor (MOS) transistor.

The switch control circuit 300 receives the digital signals D11, D12, . . . , and D1n, and outputs, responsive to these digital signals D11, D12, . . . , and D1n, a first switch control signal SC1 to control the ON/OFF states of the switches 110 and 111 in each D/A converter element 100. The switch control circuit 300 also outputs, based on the first switch control signal SC1, a second switch control signal SC2 to control the ON/OFF states of the switches 210 and 211 of each capacitor section 200. Specifically, the switch control circuit 300 receives a clock signal CLK as an input clock signal, and outputs the second switch control signal SC2 which is controlled such that the sum of the number of the switches 110 and 111 in the D/A converter elements 100, 100, . . . , that have turned ON and OFF and the number the switches 210 and 211 in the capacitor sections 200 that have turned ON and OFF is constant in each clock cycle.

Figure 3:
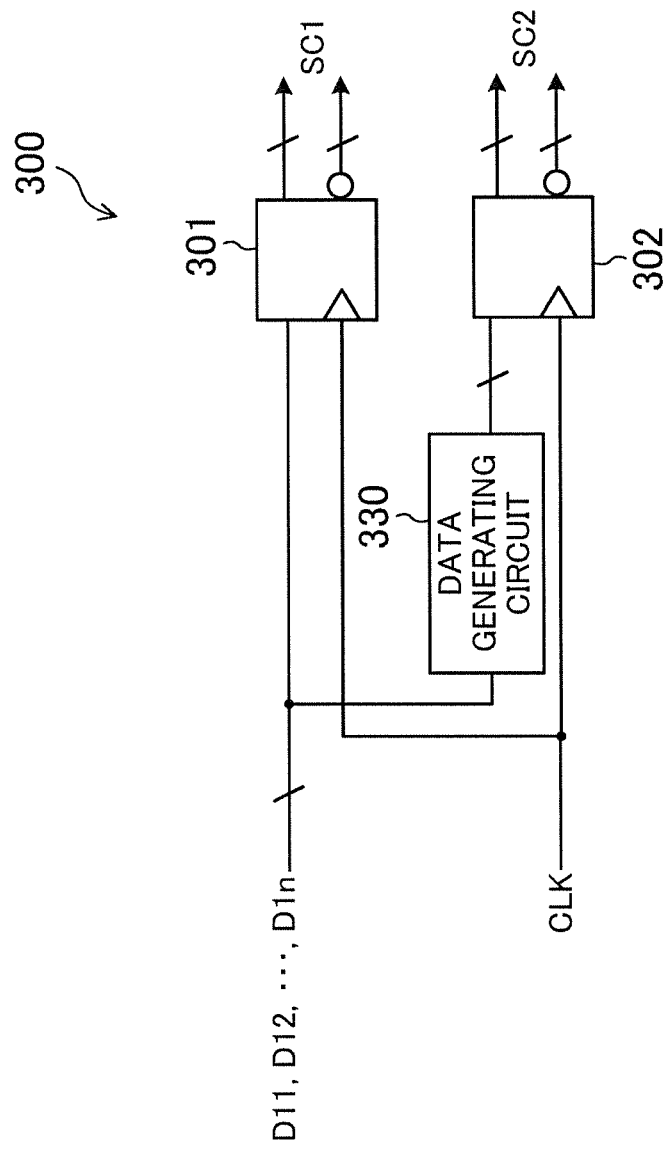
FIG. 3 schematically illustrates an example configuration for a switch control circuit.

FIG. 3 illustrates an example of the specific configuration for the switch control circuit 300. As illustrated in FIG. 3, the switch control circuit 300 includes a flip-flop circuit 301 receiving the digital signals D11, D12, . . . , and D1n and the clock signal CLK, and outputting the first switch control signal SC1 for each clock cycle. The switch control circuit 300 further includes a data generating circuit 330 and a flip-flop circuit 302. The data generating circuit 330 generates and outputs, responsive to the digital signals D11, D12, . . . , and D1n, a signal which is controlled such that the sum of the number of the switches 110 and 111 that have turned ON and OFF and the number of the switches 210 and 211 that have turned ON and OFF is constant. The flip-flop circuit 302 receives, at an input terminal thereof, the output of the data generating circuit 330, and outputs the second switch control signal SC2 for each clock cycle.

Figure 4:
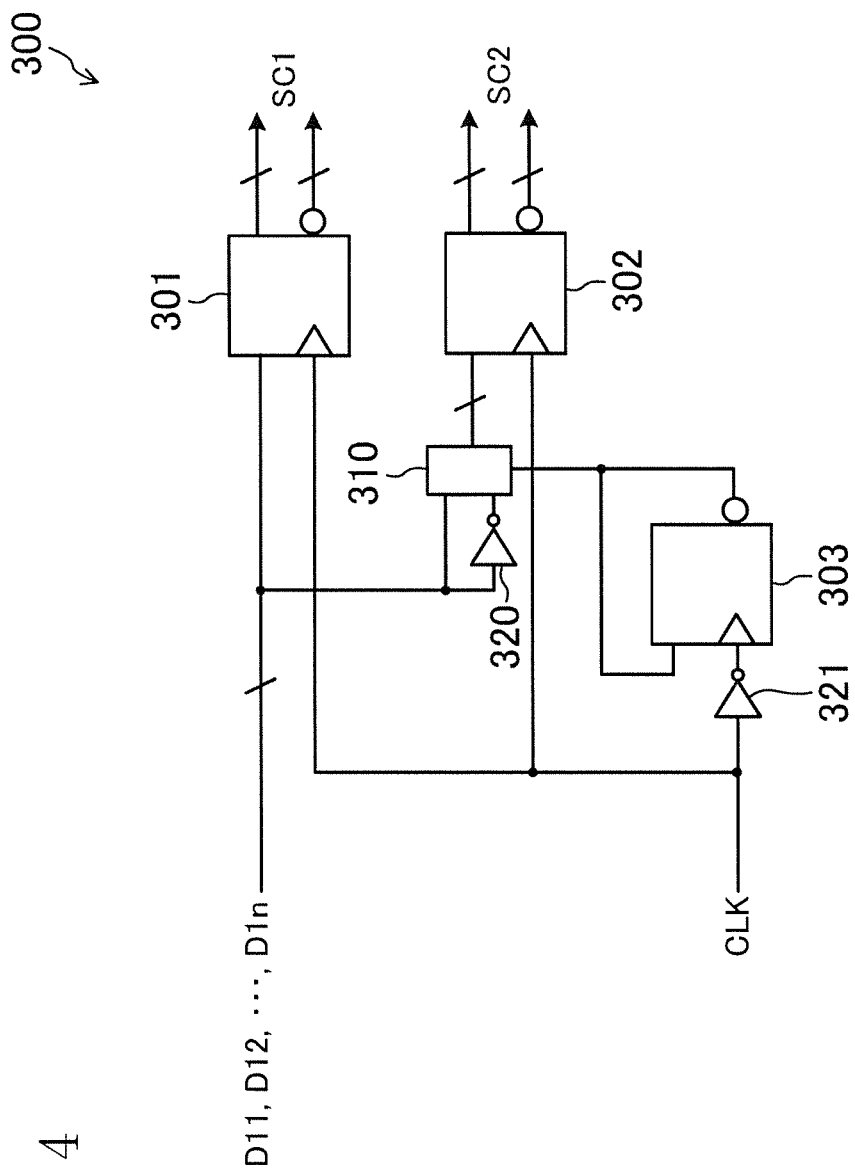
FIG. 4 schematically illustrates another example configuration for the switch control circuit.

FIG. 4 illustrates another example of the specific configuration for the switch control circuit 300. The example illustrated in FIG. 4 is different from that illustrated in FIG. 3 in that the switch control circuit 300 of FIG. 4 includes, instead of the data generating circuit 330: a flip-flop circuit 303 which receives the clock signal CLK at a clock terminal thereof via an inverter 321, and of which the inverting output terminal and input terminal are connected together; and a selector 310 which receives the digital signal D11, D12, . . . , and D1n and also receives the inverted version thereof through an inverter 320, and which selectively outputs one of these two signals to the input terminal of the flip-flop circuit 302. The selector 310 switches the digital signals D11, D12, . . . and D1n which are to be output between a non-inverted version of the signal and an inverted version thereof, in accordance with the output signal supplied from the inverting output terminal of the flip-flop circuit 303. This allows for alternately performing non-inverting control in which the ON/OFF states of the first switch control signal SC1 are controlled in the same pattern as those of the second switch control signal SC2, and inverting control in which the ON/OFF states of the first switch control signal SC1 are controlled in the inverted pattern to those of the second switch control signal SC2. By adopting a configuration such as the one shown in FIG. 4, the switch control circuit 300 is implementable in an even smaller circuit size. In addition, a switch control circuit 300 with such a simple configuration is suitable for high-speed operation. Although only two example switch control circuits 300 have been described, the circuit controlled by any other control method may be used as long as the circuit is capable of reducing the magnitude of variation in the error-representing electric charge. For example, in the switch control circuit 300, the non-inverting control and the inverting control do not have to be performed alternately every one clock. Nevertheless, in order to increase the effect of reducing occurrence of harmonic distortion, it is recommended that the non-inverting control and the inverting control be performed alternately.

(Operation of D/A Converter)

The operation of the D/A converter 1A according to the present disclosure will now be described in detail with reference to FIG. 5.

Figure 5A:
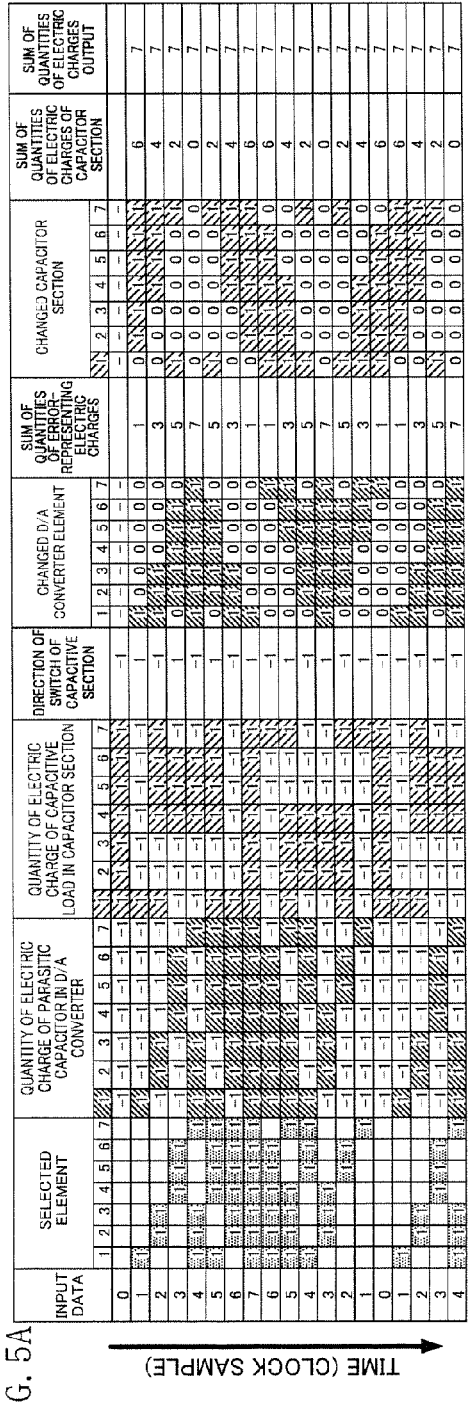
FIGS. 5A and 5B show how the quantity of the error-representing electric charge changes with an input signal in a current type D/A converter according to the present disclosure.
Figure 5B:
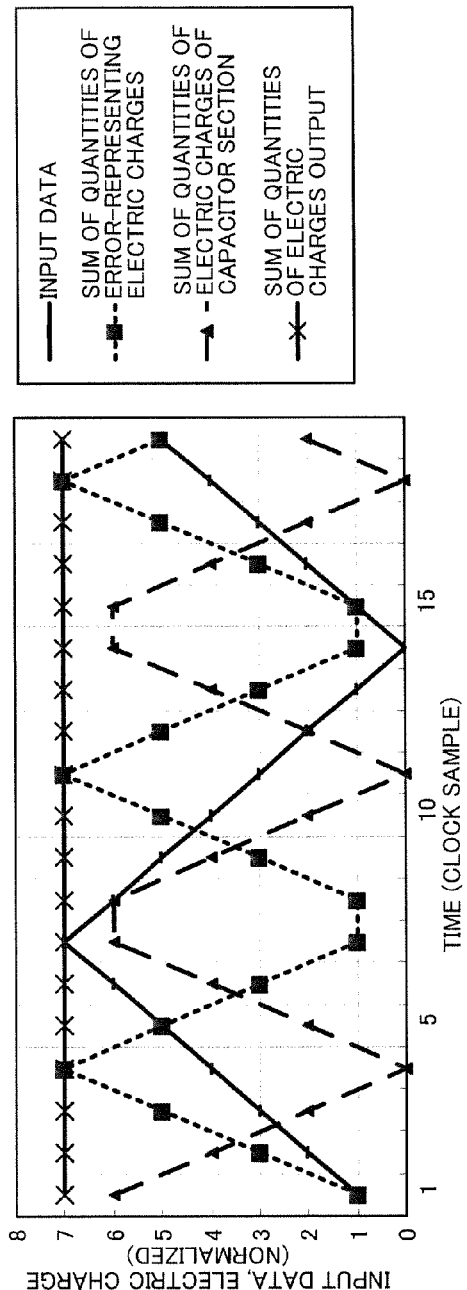

FIGS. 5A and 5B show example of the operation of the D/A converter 1A which includes seven elements and a common DEM circuit 550 which corresponds to the seven elements of the D/A converter 1A and adopts the DWA algorithm.

In the table shown in FIG. 5A, time elapses toward the bottom, and each row indicates a state in each clock sample as in FIG. 14A. "Input data" indicates data to be input to the DEM circuit 550. "Selected element" indicates the serial numbers of selected ones of the D/A converter elements 100, 100, . . . , and current is output if the value in this items is "1." "Quantity of electric charge of parasitic capacitor in D/A converter" indicates the state of the electric charge Cp stored in the parasitic capacitor 120 of each D/A converter element 100 in the D/A converter 1A. "Changed D/A converter element" indicates the serial numbers of the D/A converter elements 100, 100, . . . , which have been charged or discharged. "Quantity of electric charge of capacitive load in capacitor section" indicates the state of the electric charge stored in the capacitive load 220 (e.g., the capacitive element 221) of each capacitor section 200. "Changed capacitor section" indicates the serial numbers of the capacitor sections 200, 200, . . . , which have been charged or discharged. In "quantity of electric charge of parasitic capacitor in D/A converter" and "quantity of electric charge of capacitive load in capacitor section," "−1" indicates a discharged state, and "1" indicates a charged state. In "changed D/A converter element" and "changed capacitor section," "0" indicates the D/A converter element 100 or capacitor section 200 which has not changed, and "1" indicates the serial numbers of the D/A converter elements 100 or capacitor sections 200 which have been either charged or discharged. "Direction of switch of capacitor section" indicates the polarity of the ON- or OFF-state switches 210 and 211 in each capacitor section 200. Specifically, if the value in the table is "1," the switches 210 and 211 are controlled such that the capacitive load 220 is charged in a situation where "selected element" is "1." If the value in the table is "−1," the switches 210 and 211 are controlled such that the capacitive load 220 is charged in a situation where "selected element" is blank. "Sum of quantities of error-representing electric charges" indicates the total number of the D/A converter elements 100, 100, . . . , which have been charged or discharged, i.e., the total value (the normalized value) of quantities of the error-representing electric charges to be transferred to the integrator 511. "Sum of quantities of electric charges of capacitor sections" indicates the total number of the capacitor sections 200, 200, . . . , which have been charged or discharged. "Sum of quantities of electric charges output" indicates the value obtained by adding together the sum of quantities of the error-representing electric charges output from the D/A converter elements 100, 100, . . . , and the sum of quantities of electric charges (electric charges of the capacitor sections) output from the capacitor sections 200, 200, . . . .

FIG. 5B is a graph plotting the time (clock sampling time) as the abscissa, and the "input data," "sum of quantities of error-representing electric charges," "sum of quantities of electric charges of capacitor sections," and "sum of quantities of electric charges output" as the ordinate. The switch control circuit 300 controls the switches 210 and 211 of each capacitor section 200 such that the sum of the number of the switches 110 and 111 in the D/A converter elements 100, 100, . . . , that have turned ON or OFF and the number of the switches 210 and 211 in the capacitor sections 200, 200, . . . , that have turned ON or OFF is constant in each clock cycle. Therefore, as shown in FIG. 5B, the "sum of quantities of electric charges of capacitor sections" varies (increases or decreases) as the "sum of quantities of error-representing electric charges" increases or decreases. This allows for keeping the "sum of electric charges output" constant even if the "sum of quantities of error-representing electric charges" of the D/A converter 1A changes as the digital signals D11, D12, . . . , and D1n change. That is to say, it can be said that the "sum of electric charges output" is constant regardless of the digital signals D11, D12, . . . , and D1n which have been fed back. Accordingly, the D/A converter 1A and the delta-sigma modulator 500 including the same according to the present disclosure have no dependence on the change in the level of the digital signals D11, D12, . . . , and D1n. In other words, the error caused by the error-representing electric charge is converted into a DC component.

Figure 6:
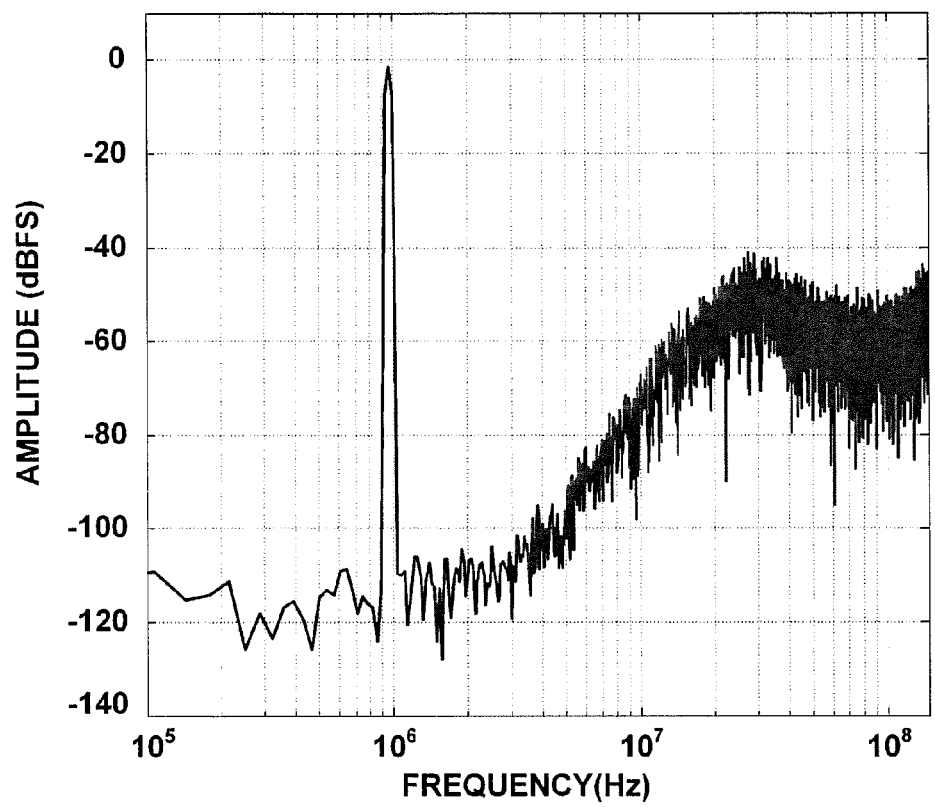
FIG. 6 shows an example of output frequency characteristic of the delta-sigma modulator according to the present disclosure.

FIG. 6 shows an example of the output spectrum in a case where the DWA algorithm is used in the delta-sigma modulator 500 including the D/A converter 1A according to the present disclosure. As shown in FIG. 6, the present disclosure allows for reducing the second-order harmonic distortion observed in FIG. 15A. In addition, the technique of the present disclosure would not cause any side effects such as an increase in noise floor.

Some embodiments have been described as mere examples of the technique disclosed in the present application. However, the technique of the present disclosure is not limited thereto but is readily implementable as various other embodiments by making modifications, substitutions, additions, and/or omissions as appropriate on the embodiments described above. Some of those other embodiments will be described below by way of alternative illustrative examples.

(Variation of D/A Converter Element)

FIGS. 7A-7F illustrate variations of the D/A converter element 100. Specifically, the same or similar advantage can also be achieved even if the D/A converter elements 100 illustrated in FIGS. 7B-7F are used instead of the D/A converter element 100 illustrated in FIG. 7A and used in FIG. 2.

FIG. 7B illustrates another example of the D/A converter element 100 in which cascaded current sources are used as the current sources 101, 102, and 103 of FIG. 7A. Specifically, the D/A converter element 100 shown in FIG. 7B includes: transistors 141 and 143 connected in series together between a power supply and the output node 401; transistors 142 and 144 connected in series together between the power supply and the output node 402; and transistors 161 and 162 connected in series together between one terminal of the switch 110 and one terminal of the switch 111 and the ground and functioning as first and second transistors, respectively. Bias nodes 131 and 132 of, e.g., a current mirror circuit are connected to the respective gates of the transistors 141 and 142, and bias nodes 133 and 134 connected in, e.g., cascade are connected to the respective gates of the transistors 143 and 144. A bias node 152 of a current mirror circuit, for example, to which a second bias is applied, is connected to the gate of the transistor 162, and a cascaded bias node 151, to which a first bias is applied, is connected to the gate of the transistor 161. The transistors 141, 142, 143, and 144 are p-channel metal oxide semiconductor (PMOS) transistors, and the transistors 161 and 162 are n-channel metal oxide semiconductor (NMOS) transistors. As in FIG. 2, the switches 110 and 111 are connected at the other terminal thereof to the output nodes 401 and 402, respectively.

FIG. 7C illustrates still another example of the D/A converter element 100 in which the current sources 101 and 102 are omitted from the configuration of FIG. 7A, and a cascaded current source is used as the current source 103. Specifically, the D/A converter element 100 illustrated in FIG. 7C includes: transistors 161 and 162 connected in series together between the ground and the one end terminal of the switch 110 and the one end terminal of the switch 111. A bias node 152 of, e.g., a current mirror circuit is connected to the gate of the transistor 162, and a cascaded bias node 151 is connected to the gate of the transistor 161. As in FIG. 2, the switches 110 and 111 are connected at the other terminal thereof to the output nodes 401 and 402, respectively.

FIG. 7D illustrates yet another example of the D/A converter element 100 in which the transistor 161 is omitted from the configuration of FIG. 7B. Accordingly, the transistor 162 is connected between the ground and the one terminal of the switch 110 and the one terminal of the switch 111, and has a gate to which the bias node 152 of, e.g., a current mirror circuit is connected.

FIG. 7E illustrates yet another example of the D/A converter element 100 in which the transistor 161 is omitted from the configuration of FIG. 7C. Accordingly, a transistor 162 is connected between the ground and the one terminal of the switch 110 and the one terminal of the switch 111, and has a gate to which the bias node 152 of, e.g., a current mirror circuit is connected.

(Variations of Capacitive Load)

FIGS. 8A-8G illustrate variations of the capacitive load 220 in the capacitor section 200. Specifically, the same or similar advantage can also be achieved even if the capacitive loads 220 illustrated in FIGS. 8B-8G are used, instead of the capacitive load 220 illustrated in FIG. 8A and used in FIG. 2, depending on which of the D/A converter elements 100 in FIGS. 7A-7E is adopted.

Figure 8A:
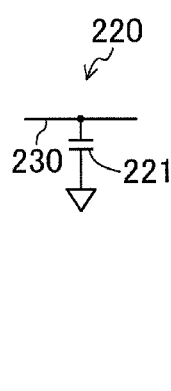
FIGS. 8A-8G illustrate variations of the capacitor section.

In the example configuration shown in FIG. 8A, the capacitive element 221 is used as the capacitive load 220 as illustrated in FIG. 2. This capacitive load 220 is applicable to any of the D/A converter elements 100 shown in FIGS. 7A-7E.

FIGS. 8B-8F illustrate example implementations of the capacitive load 220 using at least one transistor (active element).

Figure 8B:
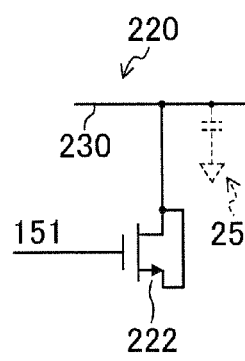

The capacitive load 220 of FIG. 8B is applicable to the D/A converter elements 100 of FIGS. 7B and 7C. Specifically, the capacitive load 220 of FIG. 8B includes an NMOS dummy transistor 222, both terminals of which are connected to a connection node 230, and which functions as a third transistor. The dummy transistor 222 has the same size as the transistor 161 in the D/A converter element 100, and has a gate connected in common to the bias node 151 along with the transistor 161. By adopting such a configuration for the capacitive load 220, a parasitic capacitor 250 having the same capacitance value Cp as the parasitic capacitor 120 of the D/A converter element 100 is formed with high precision between the switches 210 and 211 and the dummy transistor 222. Furthermore, connecting the dummy transistor 222 as described above prevents current from flowing into the dummy transistor 222 (the capacitive load 220). As a result, this allows for reducing an increase in power dissipation caused by the capacitive load 220. Note that when we say "the transistors have the same size and the same capacitance value" in this description, it means that their sizes and capacitance values are substantially equal to each other, i.e., involve some errors (e.g., errors caused by, e.g., process- or layout-induced variation). The same definition will be applied to the rest of the description.

Figure 8C:
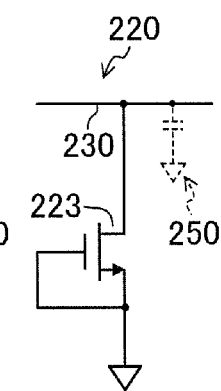

The capacitive load 220 of FIG. 8C is applicable to any of the D/A converter elements 100 of FIGS. 7B-7E. Specifically, the capacitive load 220 of FIG. 8C includes a dummy transistor 223, one terminal (i.e., the drain) of which is connected to a connection node 230, and the other terminal (i.e., the source) and the gate of which are connected to the ground, and which functions as a fifth transistor. The dummy transistor 223 has the same size as the transistor 161 of the D/A converter element 100 when applied to the D/A converter elements 100 of FIGS. 7B and 7C. The dummy transistor 223 has the same size as the transistor 162 of the D/A converter element 100 when applied to the D/A converter elements 100 of FIGS. 7D and 7E. By adopting such a configuration for the capacitive load 220, a parasitic capacitor 250 having the same capacitance value Cp as the parasitic capacitor 120 of the D/A converter element 100 is formed with high precision between the switches 210 and 211 and the dummy transistor 223. Furthermore, connecting the dummy transistor 223 as described above prevents current from flowing into the dummy transistor 223 (the capacitive load 220). As a result, this allows for reducing an increase in power dissipation caused by the capacitive load 220.

Figure 8D:
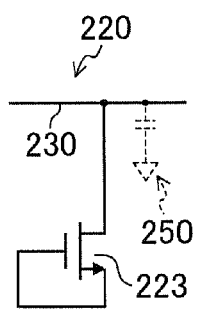

In FIG. 8C, the gate of the dummy transistor 223 is connected to the ground. However, as illustrated in FIG. 8D, the dummy transistor 223 does not have to be grounded. Alternatively, the gate and source of the dummy transistor 223 may be connected to a floating node. Even so, the same or similar advantage is achieved as in FIG. 8C.

Figure 8E:
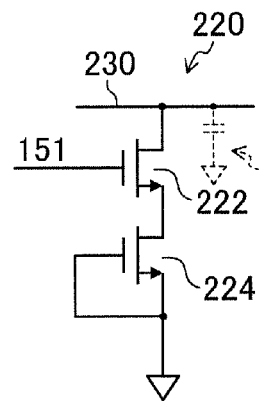
Figure 9:
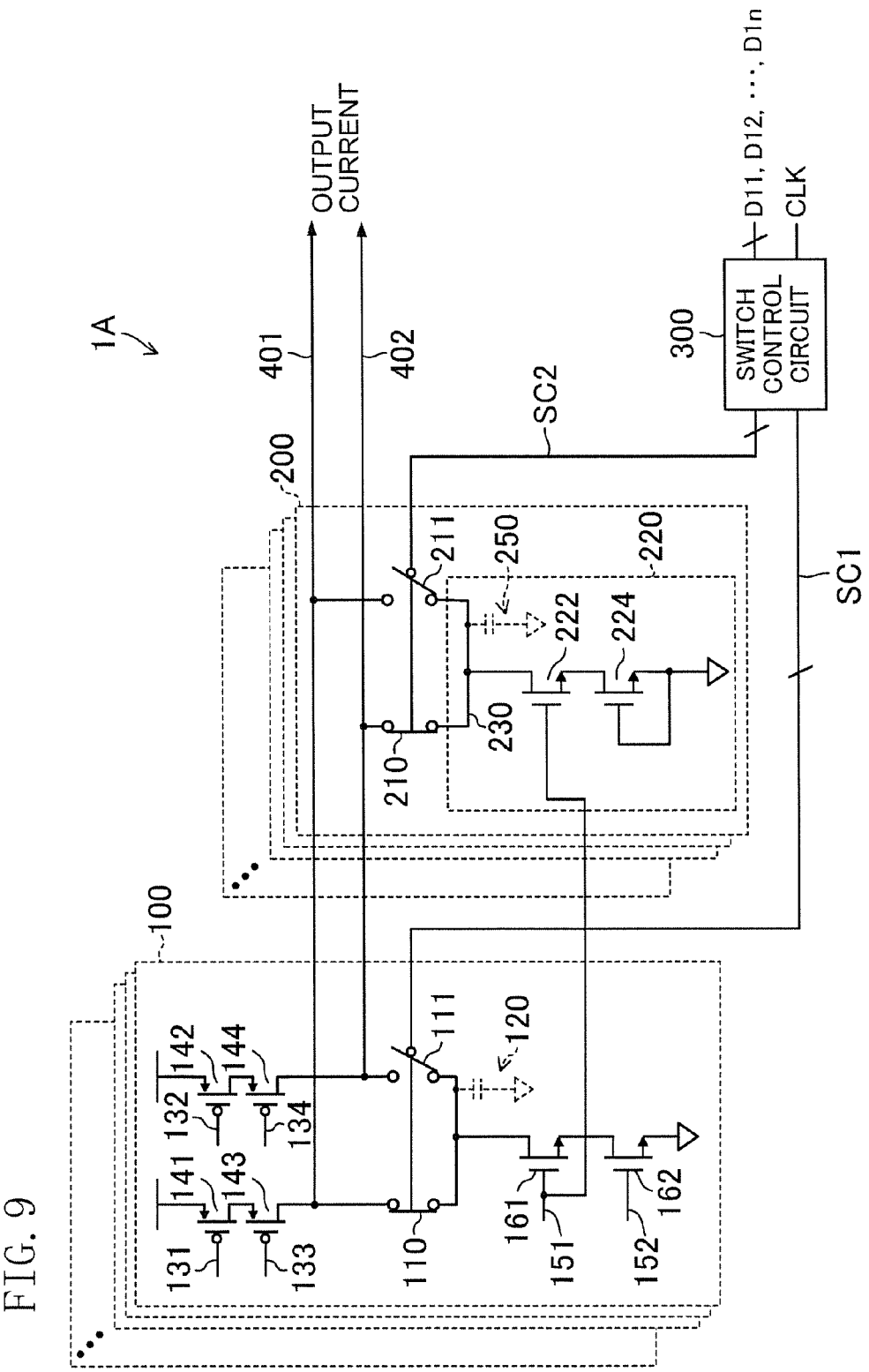
FIG. 9 conceptually illustrates another example of the current type D/A converter according to the present disclosure.

The capacitive load 220 of FIG. 8E is applicable to the D/A converter elements 100 of FIGS. 7B and 7C. FIG. 9 conceptually illustrates a current type D/A converter 1A including the D/A converter element 100 of FIG. 7B and the capacitive load 220 of FIG. 8E.

In FIG. 9, the D/A converter 1A is a multi-bit D/A converter, as in FIG. 2. The D/A converter element 100 is substantially the same as the counterpart illustrated in FIG. 7B, and the switch control circuit 300 is substantially the same as the counterpart illustrated in FIG. 2. Thus, a detailed description thereof will be omitted herein.

The capacitor section 200 includes: the switches 210 and 211 connected at one terminal thereof to the output nodes 401 and 402, respectively, and functioning as second switches; and the capacitive load 220 connected to the other terminals of the switches 210 and 211 via the connection node 230.

The capacitive load 220 includes dummy transistors 222 and 224 connected in series together between the connection node 230 and the ground. The dummy transistor 224 functions as a fourth transistor. The dummy transistor 222 has its gate connected in common to the bias node 151 along with the transistor 161 of the D/A converter element 100. The gate of the dummy transistor 224 is connected to the ground. The dummy transistors 222 and 224 has the same size as the transistors 161 and 162, respectively.

By adopting such a configuration for this D/A converter 1A, a parasitic capacitor 250 having the same capacitance value Cp as the parasitic capacitor 120 of the D/A converter element 100 is formed with high precision between the switches 210 and 211 and the dummy transistor 222. Therefore, the D/A converter 1A according to this variation can also cancel the error-representing electric charge due to the DWA algorithm. This allows for reducing occurrence of harmonic distortion. Furthermore, connecting the dummy transistor 224 as described above prevents current from flowing into the dummy transistors 222 and 224.

Figure 10:
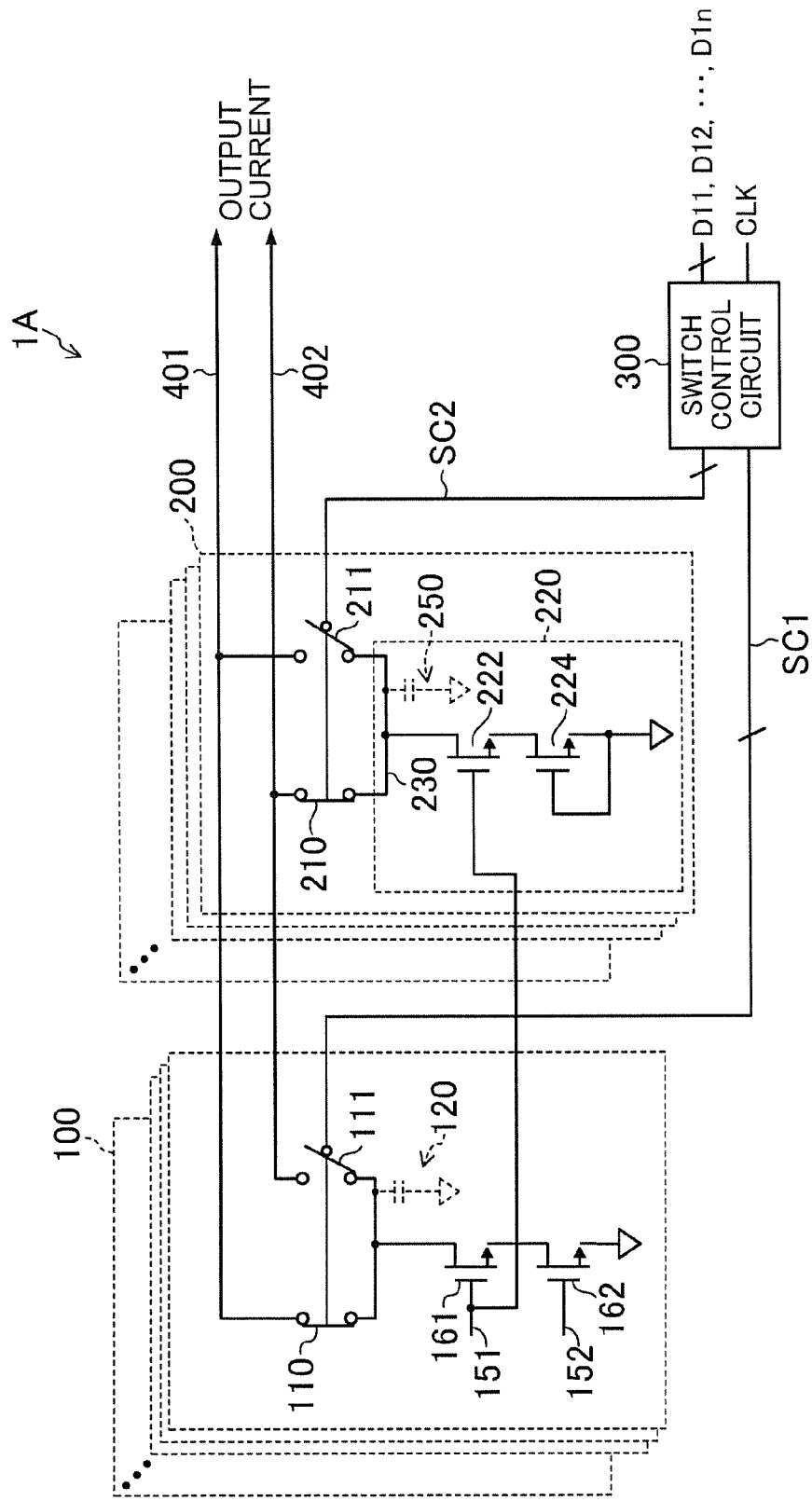
FIG. 10 conceptually illustrates another example of the current type D/A converter according to the present disclosure.

FIG. 10 conceptually illustrates a current type D/A converter 1A including the D/A converter element 100 of FIG. 7C and the capacitive load 220 of FIG. 8E.

In FIG. 10, the D/A converter 1A is a multi-bit D/A converter, as in FIG. 2. The D/A converter element 100 includes: the switches 110 and 111 connected at one terminal thereof to the output nodes 401 and 402, respectively, and functioning as first switches; and the transistors 161 and 162 connected in series together between the other terminals of the switches 110 and 111 and the ground, and functioning as current sources. The cascaded bias node 151 is connected to the gate of the transistor 161, and the bias node 152 of, e.g., a current mirror circuit is connected to the gate of the transistor 162. The switches 110 and 111 are configured to be switchable between electrically connected and disconnected states, and there is a parasitic capacitor 120 having a capacitance value Cp between the switches 110 and 111 and the transistor 161. The configurations of the capacitor section 200 and the switch control circuit 300 are substantially the same as those in FIG. 9, and detailed description thereof will be omitted herein.

By adopting such a configuration for the D/A converter 1A, a parasitic capacitor 250 having the same capacitance value Cp as the parasitic capacitor 120 of the D/A converter element 100 is formed with high precision between the switches 210 and 211 and the dummy transistor 222. Accordingly, the D/A converter 1A according to this variation can also cancel the error-representing electric charge due to the DWA algorithm. This allows for reducing occurrence of harmonic distortion. Furthermore, connecting the dummy transistor 224 as described above prevents current from flowing into the dummy transistors 222 and 224.

Figure 8F:
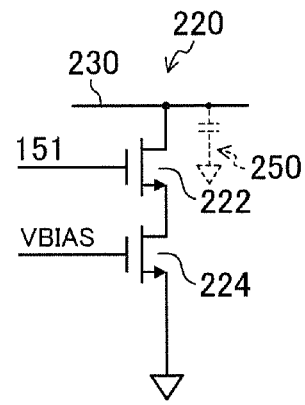

In FIGS. 9 and 10, the gate of the dummy transistor 224 is connected to the ground. However, as illustrated in FIG. 8F, another bias VBIAS may be applied to the gate of the dummy transistor 224. In this case, the bias VBIAS is preferably controlled such that almost no current flows through the dummy transistor 224. Even so, the same or similar advantage is achieved as in FIGS. 9 and 10.

(Example of Single-Ended Circuit Configuration)

FIG. 7F illustrates an example of the D/A converter element 100 having a single-ended circuit configuration. Specifically, the D/A converter element 100 illustrated in FIG. 7F includes: a current source 191 connected between a power supply and the output node 403; a switch 112 connected at one terminal thereof to the output node 403 and functioning as a first switch; and a current source 192 connected between the other terminal of the switch 112 and the ground. The switch 112 is configured to be switchable between electrically connected and disconnected states. Also, there is a parasitic capacitor 120 having a capacitance value of Cp at a connection node between the switch 112 and the current source 192.

Figure 8G:
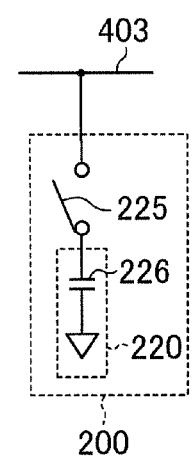

In this configuration, the capacitor section 200 includes: a switch 225 connected at one terminal thereof to the output node 403 and functioning as a second switch; and the capacitive load 220 connected to the other terminal of the switch 225, as illustrated in FIG. 8G, for example. The capacitive load 220 is implementable as a capacitive element 226 connected between the other terminal of the switch 225 and the ground, for example.

As can be seen, the D/A converter element 100 with such a single-ended circuit configuration allows for reducing the overall circuit area on the chip, as compared with other circuit configurations. In this single-ended circuit configuration, cascade current sources may also be used as the current sources 191 and 192, and a transistor may be used as the capacitive load 220.

(Application Example)

Figure 11:
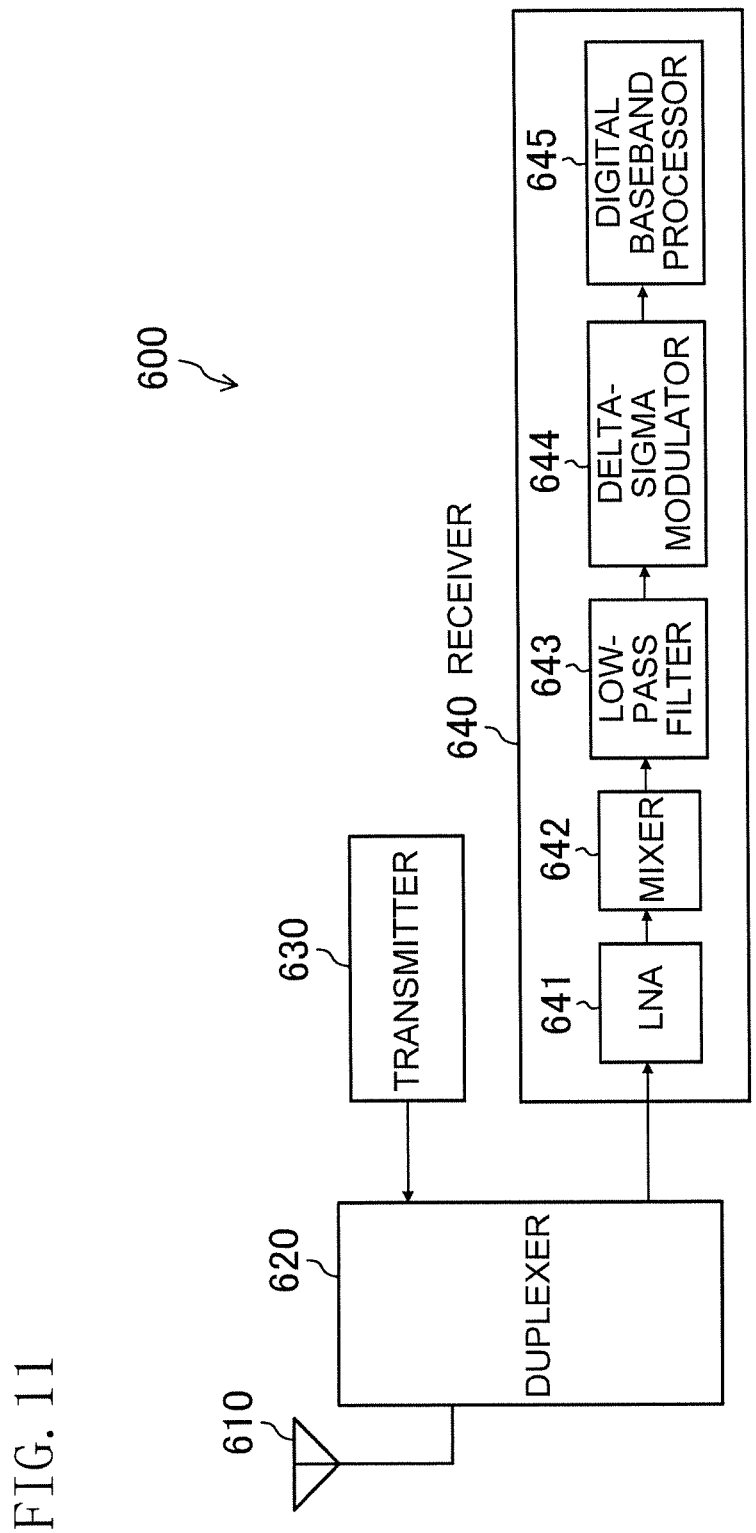
FIG. 11 illustrates a wireless communications device as an example application of the present disclosure.

FIG. 11 is a block diagram illustrating an example configuration of a communications device 600 including the D/A converter 1A and the delta-sigma modulator 500 according to the present disclosure.

The communications device 600 of FIG. 11 includes: an antenna 610 by which a radio wave is received/transmitted; a transmitter 630 configured to perform a predetermined transmission process including a modulation process on a signal to be transmitted; a receiver 640 configured to perform a predetermined reception process including a decoding process on a received signal; and a duplexer 620 configured to perform switching between the signal to be transmitted and the received signal.

The receiver 640 includes a low noise amplifier (LNA) 641, a mixer 642, a low-pass filter 643, a delta-sigma modulator 644 according to any of the embodiments described above (e.g., the delta-sigma modulator 500 illustrated in FIG. 2), and a digital baseband processor 645.

Use of such a configuration allows for providing a high precision communications device. Thus, application of such a configuration to, e.g., a mobile telecommunications terminal device allows for providing a terminal device capable of achieving high sending and receiving transmission quality.

The order of the integrator in the delta-sigma modulator according to the present disclosure may be set arbitrarily, and the configuration of the modulator including the number of the D/A converters may also be determined arbitrarily.

In the delta-sigma modulator 500 illustrated in FIG. 1, the D/A converter 1A according to the present disclosure is applied to only the D/A converter 580 configured to supply a feedback signal (analog signal) to the initial-stage integrator 511. However, the range of application may be changed flexibly depending on the trade-off between the target performance and the circuit size. For example, the D/A converter 1A according to the present disclosure may be applied to all of the D/A converters 560, 570, and 580 in the delta-sigma modulator 500.

In the D/A converter element 100 of the D/A converter 1A illustrated in FIG. 2, the switches 110 and 111 and the current source 103 are connected in series together between the output nodes 401 and 402 and the ground. However, this is only a non-limiting example. Alternatively, the current source 103 illustrated in FIG. 2 may be replaced with a resistive element. In such a configuration, it is the current sources 101 and 102 that supply the output current of the D/A converter element 100. Use of such a configuration also allows for achieving the same or similar advantage as in FIG. 2. Furthermore, the current sources 101 and 102 may be replaced with resistive elements, and the current source 103 may supply the output current. In this configuration, there is a parasitic capacitor 120 between the switches 110 and 111 and the current source 103.

The configuration of the communications device may be changed depending on what communications system the communications device is applied to. For example, the transmitter 630 and the duplexer 620 may be omitted from the communications device 600 to make the communications device 600 function as a receive-only communications device.

The D/A converter according to the present disclosure allows for reducing occurrence of harmonic distortion, and is thus useful for delta-sigma modulators and data converting circuits. This D/A converter is also useful for receiver circuits for use in various communications devices including such modulators and data converting circuits such as wireless communications devices (e.g., mobile telecommunications terminals), base stations, and tuners. This D/A converter is also useful for audio devices, video devices, various types of sensors, medical electronic devices, and data converting circuits for use in such devices, these devices and circuits including such modulators and data converting circuits.

What is claimed is:

1. A current type D/A converter comprising a plurality of D/A converter elements and performing D/A conversion of a digital input signal, wherein
each of the D/A converter elements includes: a current source configured to supply output current to an output node; and a first switch configured to control the output current by switching between electrically connected and disconnected states, the current source and the first switch being connected in series to each other,
the output node of at least one of the D/A converter elements is provided with a capacitor section including a capacitive load and a second switch connected between the capacitive load and the output node, and configured to switch between electrically connected and disconnected states,
the D/A converter further comprises a control circuit configured to control an ON/OFF state of the first switch responsive to the digital input signal, and control an ON/OFF state of the second switch in accordance with the control of the ON/OFF state of the first switch, and
the control circuit controls the ON/OFF state of the second switch such that the D/A converter reduces a magnitude of variation in an error-representing electric charge which is to be transferred to the output node.

2. The current type D/A converter of claim 1, wherein the control circuit controls the ON/OFF states of the first and second switches responsive to an input clock signal, and controls the ON/OFF state of the second switch in accordance with the control of the ON/OFF state of the first switch such that a sum of the number of the first switches that have turned ON and OFF and the number of the second switches that have turned ON and OFF is constant in each cycle of the input clock signal.

3. The current type D/A converter of claim 1, wherein the control circuit controls the ON/OFF states of the first and second switches responsive to an input clock signal, and alternately performs, in each cycle of the input clock signal, non-inverting control on the second switch such that the second switch turns ON and OFF in a same pattern as the first switch, and inverting control on the second switch such that the second switch turns ON and OFF in an inverted pattern to the first switch.

4. The current type D/A converter of claim 1, wherein
the first switch is connected between the current source and the output node,
the capacitive load has a same capacitance value as a parasitic capacitor present at a connection node between the first switch and the current source,
one terminal of the first switch is connected to the output node,
the current source includes: a first transistor configured to receive a first bias voltage at its gate; and a second transistor configured to receive a second bias voltage at its gate, the first and second transistors being connected in series together between the other terminal of the first switch and a first power supply, and
the capacitive load includes a third transistor, one terminal of which is connected to the output node via the second switch, and which is configured to receive the first bias voltage at its gate.

5. The current type D/A converter of claim 4, wherein the capacitive load includes a fourth transistor, one terminal of which is connected to the other terminal of the third transistor, and the other terminal and a gate of which are connected to the first power supply.

6. The current type D/A converter of claim 4, wherein the first transistor has a same size as the third transistor.

7. The current type D/A converter of claim 1, wherein
the first switch is connected between the current source and the output node,
the capacitive load has a same capacitance value as a parasitic capacitor present at a connection node between the first switch and the current source,
the current source includes a second transistor configured to receive a second bias voltage at its gate and supply current from the current source through the first switch, and
the capacitive load includes a fifth transistor, one terminal of which is connected to the output node via the second switch, and the other terminal and a gate of which are connected together.

8. The current type D/A converter of claim 1, wherein the capacitor section includes as many capacitor sections as the D/A converter elements, and the output node of each of the D/A converter elements is connected to an associated one of the capacitor sections.

9. The current type D/A converter of claim 1, wherein the capacitive load is configured as a passive element.

10. The current type D/A converter of claim 1, wherein the capacitive load is configured as an active element.

11. A delta-sigma modulator comprising:
an analog filter;
a quantizer configured to receive an output signal of the analog filter and convert the output signal into a digital output signal;
a DEM circuit configured to receive the digital output signal of the quantizer; and
the current type D/A converter of claim 1 configured to D/A convert the digital output signal of the DEM circuit into an analog signal, and feed the analog signal back to the analog filter.

12. A communications device including the delta-sigma modulator of claim 11.

\* \* \* \* \*